(12) United States Patent
Meade et al.

(10) Patent No.: US 11,393,687 B2
(45) Date of Patent: Jul. 19, 2022

(54) SEMICONDUCTOR DEVICES INCLUDING TWO-DIMENSIONAL MATERIAL STRUCTURES

(71) Applicant: Micron Technology, Inc., Boise, ID (US)

(72) Inventors: Roy E. Meade, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 15/986,129

(22) Filed: May 22, 2018

(65) Prior Publication Data

US 2018/0277373 A1    Sep. 27, 2018

Related U.S. Application Data

(62) Division of application No. 15/253,454, filed on Aug. 31, 2016, now Pat. No. 9,991,122.

(51) Int. Cl.
*H01L 21/268* (2006.01)
*H01L 21/02* (2006.01)
(Continued)

(52) U.S. Cl.
CPC ........ *H01L 21/268* (2013.01); *H01L 21/0259* (2013.01); *H01L 21/02521* (2013.01);
(Continued)

(58) Field of Classification Search
CPC . H01L 29/0665; H01L 21/268; H01L 21/428; H01L 21/02521; H01L 21/02568;
(Continued)

(56) References Cited

U.S. PATENT DOCUMENTS

| 5,367,980 A | 11/1994 | Horn et al. |
| 8,569,149 B2 | 10/2013 | Meade |

(Continued)

FOREIGN PATENT DOCUMENTS

| CN | 104282749 A | 1/2015 |
| CN | 105895385 A | 8/2016 |

(Continued)

OTHER PUBLICATIONS

Taiwanese Search Report and Written Opinion for Taiwanese Application No. 106128291, dated May 24, 2018, 7 pages with English translation.

(Continued)

*Primary Examiner* — Benjamin Tzu-Hung Liu
(74) *Attorney, Agent, or Firm* — TraskBritt

(57) ABSTRACT

A method of forming a semiconductor device structure comprises forming at least one 2D material over a substrate. The at least one 2D material is treated with at least one laser beam having a frequency of electromagnetic radiation corresponding to a resonant frequency of crystalline defects within the at least one 2D material to selectively energize and remove the crystalline defects from the at least one 2D material. Additional methods of forming a semiconductor device structure, and related semiconductor device structures, semiconductor devices, and electronic systems are also described.

7 Claims, 3 Drawing Sheets

(51) Int. Cl.
*H01L 21/428* (2006.01)
*H01L 21/477* (2006.01)
*H01L 29/06* (2006.01)

(52) U.S. Cl.
CPC .. *H01L 21/02568* (2013.01); *H01L 21/02675* (2013.01); *H01L 21/428* (2013.01); *H01L 21/477* (2013.01); *H01L 29/0665* (2013.01)

(58) Field of Classification Search
CPC .......... H01L 21/0259; H01L 21/02675; H01L 21/477; H01L 21/02112; H01L 27/0611
See application file for complete search history.

(56) References Cited

U.S. PATENT DOCUMENTS

| | | | |
|---|---|---|---|
| 9,035,282 | B2 | 5/2015 | Dimitrakopoulos et al. |
| 2006/0063188 | A1 | 3/2006 | Zanni et al. |
| 2011/0089403 | A1 | 4/2011 | Woo et al. |
| 2011/0092054 | A1 | 4/2011 | Seo et al. |
| 2011/0309336 | A1 | 12/2011 | Shin et al. |
| 2014/0034899 | A1 | 2/2014 | Ahn et al. |
| 2014/0162130 | A1* | 6/2014 | Barsoum ............... C01B 32/914 429/231.8 |
| 2014/0239256 | A1 | 8/2014 | Kim et al. |
| 2014/0264282 | A1 | 9/2014 | Lee et al. |
| 2014/0339506 | A1 | 11/2014 | Dimitrakopoulos et al. |
| 2014/0342127 | A1 | 11/2014 | Dimitrakopoulos et al. |
| 2015/0155287 | A1 | 6/2015 | Heo et al. |
| 2015/0179449 | A1 | 6/2015 | Anikitchev |
| 2015/0255661 | A1 | 9/2015 | Liang et al. |
| 2016/0047059 | A1 | 2/2016 | Kim et al. |
| 2016/0093491 | A1 | 3/2016 | Choi et al. |
| 2016/0123973 | A1 | 5/2016 | Cubukcu et al. |
| 2016/0141174 | A1 | 5/2016 | Chiappe |
| 2016/0258081 | A1 | 9/2016 | Ozyilmaz et al. |
| 2017/0025505 | A1* | 1/2017 | Geohegan .......... H01L 21/0332 |
| 2017/0102358 | A1* | 4/2017 | Hoffman .......... H01L 21/76879 |
| 2017/0175258 | A1* | 6/2017 | Robinson ............... C23C 16/305 |
| 2018/0061665 | A1 | 3/2018 | Meade et al. |

FOREIGN PATENT DOCUMENTS

| | | | |
|---|---|---|---|
| GB | WO-2016/203184 | * | 12/2016 |
| JP | 06-120138 | A | 4/1994 |
| JP | 11-026389 | A | 1/1999 |
| JP | 2001-338894 | A | 12/2001 |
| JP | 2004-158627 | A | 6/2004 |
| JP | 2007-273943 | A | 10/2007 |
| JP | 2008-147487 | A | 6/2008 |
| JP | 2011-014914 | A | 1/2011 |
| JP | 2011233709 | A | 11/2011 |
| JP | 5004160 | B2 | 8/2012 |
| JP | 5433631 | B2 | 3/2014 |
| JP | 2014-204122 | A | 10/2014 |
| JP | 5610471 | B2 | 10/2014 |
| JP | 2016-127267 | A | 7/2016 |
| KR | 10-2011-0042952 | A | 4/2011 |
| KR | 10-2014-0037703 | A | 3/2014 |
| KR | 10-2015-0051823 | A | 5/2015 |
| KR | 10-2015-0059000 | A | 5/2015 |
| KR | 10-2015-0062878 | A | 6/2015 |
| KR | 10-2016-0010217 | A | 1/2016 |
| KR | 10-2016-0081102 | A | 7/2016 |
| WO | 2014/190352 | A1 | 11/2014 |
| WO | 2015/072927 | A1 | 5/2015 |
| WO | 2015/191089 | A1 | 12/2015 |

OTHER PUBLICATIONS

Haldar et al., A Systematic Study of Structureal, Electronic and Optical Properties of Atomic Scale Defects in 2D Transition Metal Dichalcogenides MX2 (M=Mo,W; X=s, Se, Te), Physcial Review B, vol. 92, (Dec. 7, 2015), 13 pages.

Huang et al., Alloy Engineering of Defect Properties in Semiconductors: Suppression of Deep Levels in Transition-Metal Dichalcogenides, Physical Review Letters, vol. 115, No. 12(Sep. 18, 2015), 126806-1-126806-5.

International Search Report from International Application No. PCT/US2017/045852, dated Nov. 20, 2017, 3 pages.

International Written Opinion from International Application No. PCT/US2017/045852, dated Nov. 20, 2017, 6 pages.

Jariwala et al., Emerging Device Applications for semiconducting Two-Dimensional Transition Metal Dichalcogenides, ACS Nano, (Feb. 25, 2014), vol. 8, No. 2, 55 pages.

Lee et al., Random Telegraph Signal Noise Simulation of Decanano MOSFETs Subject to Atomic Scale Structure Variation, Superlattices and Microstructures, vol. 34, (2003), pp. 293-300.

Lin et al., Silicon Nitride Films Deposited by Atmospheric Pressure Chemical Vapor Deposition, Mat. Res. Soc. Symp. Proc., vol. 495, (1998), pp. 107-112.

Wang et al., Electronics and Optoelectronics of Two-Dimensional Transition Metal Dichalcogenides, Nature Nanotechnology, Review Article, vol. 7, (Nov. 6, 2012), pp. 699-712.

Second Japanese Office Action for Application No. 2019-507949, dated Jun. 30, 2020, 6 pages.

European Extended Search Report and Opinion for European Application No. 17847183.5 dated Apr. 3, 2020, 7 pages.

Japanese Office Action for Application No. 2019-507949, dated Mar. 17, 2020, 15 pages.

Korean Notice of Rejection for Application No. 10-2019-7007931, dated May 15, 2020, 23 pages.

Duan et al., "Two-dimensional transition metal dichalcogenides as atomically thin semiconductors: opportunities and challenges", Chem. Soc. Rev. , vol. 44, pp. 8859-8876.

Korean Decision of Rejection for Application No. 10-2019-7007931, dated Nov. 16, 2020, 13 pages.

Korean Notice of Allowance for Application No. 10-2019-7007931, dated Dec. 22, 2020, 5 pages.

Korean Notice of Reasons for Rejection for Application No. 10-2020-7035745, dated Dec. 30, 2020, 12 pages.

Lu et al., "Atomic Healing of Defects in Transition Metal Dichalogenicides", Nano Lett, vol. 15, pp. 3524-3532.

Coleman Jonathan N., "Liquid Exfoliation of Defect-Free Graphene", Accounts of Chemical Research, Mar. 20, 2012, vol. 46, No. 1. pages 14-22.

Search Report of the Intellectual Property Office of Singapore for Application No. 10201913614P, dated Sep. 7, 2021, 5 pages.

Korean Notice of Allowance for Application No. 10-2020-7035745, dispatched Jul. 24, 2021, 4 pages.

* cited by examiner

SEMICONDUCTOR DEVICES INCLUDING TWO-DIMENSIONAL MATERIAL STRUCTURES

CROSS-REFERENCE TO RELATED APPLICATION

This application is a divisional of U.S. patent application Ser. No. 15/253,454, filed Aug. 31, 2016, now U.S. Pat. No. 9,991,122, issued Jun. 5, 2018 the disclosure of which is hereby incorporated herein in its entirety by this reference.

TECHNICAL FIELD

Embodiments of the disclosure relate to the field of semiconductor device design and fabrication. More specifically, embodiments of the disclosure relate to methods of forming semiconductor device structures including two-dimensional material structures, and to related semiconductor device structures, semiconductor devices, and electronic systems.

BACKGROUND

Two-dimensional (2D) materials are currently being investigated for use in various semiconductor devices. As used herein, a "two-dimensional material" or "2D material" refers to a crystalline material formed of and including a single (e.g., only one) monolayer of units (e.g., atoms, molecules) bonded together through intramolecular forces (e.g., covalent bonds). Adjacent 2D materials of a structure (e.g., a stack structure) including multiple 2D materials are coupled to one another through one or more intermolecular forces (e.g., Van der Waals forces). Put another way, units (e.g., atoms, molecules) of a single 2D material are coupled to one another through intramolecular forces, and may be coupled to units (e.g., atoms, molecules) of a second 2D material adjacent (e.g., thereover, thereunder) thereto (if any) through intermolecular forces. The thin structure of 2D materials, along with a direct band gap in the visible portion of the electromagnetic spectrum, suggests that 2D materials are suitable for use in a wide variety of digital electronic devices and optoelectronic devices.

Unfortunately, problems associated with conventionally forming 2D materials can reduce the performance and reliability of semiconductor devices (e.g., digital electronic devices, optoelectronic devices) into which the 2D materials are incorporated. For example, conventional methods of forming 2D materials can result in significant crystalline defects within the 2D materials that can negatively impact the properties of semiconductor device structures and semiconductor devices including the 2D materials. For example, conventionally formed 2D materials can exhibit undesirable interstitial and vacancy defects, such as those described by Haldar, S., et al., "A systematic study of structural, electronic and optical properties of atomic scale defects in 2D transition metal dichalcogenides $MX_2$ (M=Mo, W; X=S, Se, Te)," *Phys. Rev.* B 92, 2015. Such crystalline defects can effectuate non-uniform local electron densities, current leakage, and shallow subthreshold slope in the 2D materials, resulting in unacceptable semiconductor device variation.

It would, therefore, be desirable to have improved methods of forming 2D materials permitting the fabrication of semiconductor device structures and semiconductor devices having improved performance characteristics.

DETAILED DESCRIPTION

Figure 1:
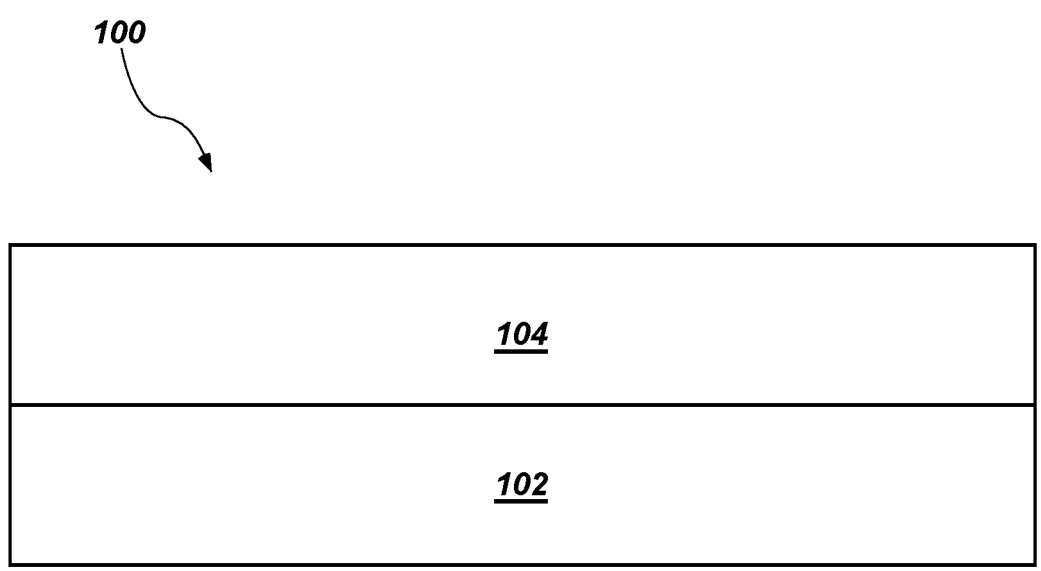
FIG. 1 is a partial cross-sectional view of a semiconductor device structure, in accordance with embodiments of the disclosure.

Methods of forming semiconductor device structures including 2D material structures are disclosed, as are related semiconductor device structures, semiconductor devices, and electronic systems. In some embodiments, a method of forming a semiconductor device structure includes forming at least one 2D material on or over a substrate, and subjecting the 2D material to at least one laser treatment process to selectively energize, mobilize, and at least partially (e.g., substantially) eliminate crystalline defects (e.g., interstitial defects, vacancy defects) within the 2D material. The laser treatment process includes selecting at least one frequency of electromagnetic radiation to expose the 2D material to at least partially based on a comparison of vibrational spectra for a crystalline-defect-free form of the 2D material and a crystalline-defect-laden form of the 2D material, and then exposing the 2D material to the selected frequency (or frequencies) of radiation during and/or after the formation of the 2D material on or over the substrate. The frequency (or frequencies) of electromagnetic radiation may be selected by identifying mutual (e.g., common, shared) resonant frequencies along the vibrational spectra where there is a difference between the resonant peak intensities of the crystalline-defect-free form of the 2D material and the crystalline-defect-laden form of the 2D material. The at least one selected frequency of electromagnetic radiation may directly correspond to (e.g., be substantially the same as, such as exactly the same as) one or more of such mutual resonant frequencies. Optionally, one or more of a thermal annealing process and a remote plasma treatment process may be used in conjunction with the laser treatment process. For example, at least one thermal annealing process may be performed before, during, and/or after the laser treatment process to assist with or at least partially facilitate the removal of crystalline defects from the 2D material. The methods of the disclosure may efficiently reduce or even eliminate a crystalline defect density within the 2D material to form a 2D material structure having enhanced electrically properties as compared to conventional 2D material structures formed without the use of the methods of the disclosure.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "configured" refers to a size, shape, material composition, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct ohmic connection or through an indirect connection (e.g., via another structure).

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

An embodiment of the disclosure will now be described with reference to FIG. 1, which illustrates a semiconductor device structure 100 including a substrate 102 and a 2D material structure 104 on or over the substrate 102. While FIG. 1 depicts a particular configuration of the semiconductor device structure 100, one of ordinary skill in the art will appreciate that different semiconductor device structure configurations (e.g., shapes, sizes, etc.) are known in the art and that may be adapted to be employed in embodiments of the disclosure. FIG. 1 illustrates just one non-limiting example of the semiconductor device structure 100.

The substrate 102 may comprise any base material or construction upon which additional materials may be formed. The substrate 102 may be a semiconductor substrate, a base semiconductor material on a supporting structure, a metal electrode, or a semiconductor substrate having one or more materials, structures, or regions formed thereon. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. By way of non-limiting example, a substrate 102 may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

The 2D material structure 104 is formed of and includes one or more 2D materials. By way of non-limiting example, the 2D material structure 104 may be formed of and include one or more of graphene; graphene-oxide; stanene; phosphorene; hexagonal boron nitride (h-BN); borophene; silicene; graphyne; germanene; germanane; a 2D supracrystal; a transition metal dichalcogenide (TMDC) having the general chemical formula $MX_2$, wherein M is a transition metal (e.g., molybdenum (Mo), tungsten (W), niobium (Nb), zirconium (Zr), hafnium (Hf), rhenium (Re), platinum (Pt), titanium (Ti), tantalum (Ta), vanadium (V), cobalt (Co) cadmium (Cd), or chromium (Cr)) and X is a chalcogen (e.g., sulfur (S), selenium (Se), or tellurium (Te)); a carbide or carbonitride having the general chemical formula $M_{n+1}X_n$ (also referred to as an "MXene") and including oxygen (—O), hydroxyl (—OH), or fluoro (—F) surface termination, wherein M is a transition metal from Groups IV or V of the Periodic Table of Elements (e.g., Ti, Hf, Zr, V, Nb, Ta) and X is selected from carbon (C) and nitrogen (N); and a monolayer of a metal material (e.g., palladium (Pd), rhodium (Rh)), a semi-metal material, or a semiconductive material. In some embodiments, the 2D material structure 104 is formed of and includes one or more TMDC monolayer(s), such as one or more monolayer(s) of $MoS_2$, $MoSe_2$, $MoTe_2$, $WS_2$, $WSe_2$, $WTe_2$, $NbSe_2$, $ZrS_2$, $ZrSe_2$, $HfS_2$, $HfSe_2$, and $ReSe_2$.

The 2D material structure 104 may include a single (e.g., only one) 2D material, or may include multiple (e.g., more than one) 2D materials. By way of non-limiting example, the 2D material structure 104 may be formed of and include a stack of at least two different 2D materials. A first of the 2D materials may be formed on or over the substrate 102, and a second of the 2D materials may be formed on the first of the 2D materials. In addition, one or more additional 2D materials may, optionally, be formed on or over the second of the 2D materials. If the 2D material structure 104 comprises a stack of different 2D materials, longitudinally adjacent 2D materials of the stack may be coupled to one another through one or more intermolecular forces, such as Van der Waals forces (e.g., as opposed to intramolecular forces, such as covalent bonds). In some embodiments, the 2D material structure 104 is formed of and includes only one 2D material. In additional embodiments, the 2D material structure 104 is formed of and includes more than one 2D material. While the 2D material structure 104 is illustrated in FIG. 1 as a planar structure, in additional embodiments the 2D material structure 104 may exhibit a different structural configuration, such as a non-planar structure.

As described in further detail below, the 2D material structure 104 exhibits reduced crystalline defects as compared to conventional 2D material structures having the same 2D material composition (e.g., formed of and including the same 2D material(s)) but formed through conventional processes. The 2D material structure 104 may, for example, exhibit a reduced density of interstitial defects and/or vacancy defects as compared to conventional 2D material structures having the same 2D material composition. By way of non-limiting example, if the 2D material structure 104 is formed of and includes at least one TMDC having the general chemical formula $MX_2$ (e.g., $MoS_2$, $MoSe_2$, $MoTe_2$, $WS_2$, $WSe_2$, $WTe_2$, $NbSe_2$, $ZrS_2$, $ZrSe_2$, $HfS_2$, $HfSe_2$, $ReSe_2$), the TMDC may have a reduced number of one or more of X-interstitial defects, X-vacancy defects, M-interstitial defects, M-vacancy defects, MX-vacancy defects, and XX-vacancy defects as compared to a 2D material structure having the same 2D material composition, but formed through a conventional process. The above-mentioned defects are collectively referred to herein as crystalline defects. In some embodiments, the 2D material structure 104 is formed of at least one TMDC at least exhibiting a reduced number of X-interstitial and X-vacancy defects as compared to a 2D material structure formed of the at least one TMDC through a conventional process. In additional embodiments, the 2D material structure 104 is formed of and includes at least one 2D material substantially free (e.g., completely free) of all crystalline defects.

The 2D material structure 104 may be formed on or over the substrate 102 by forming (e.g., growing, depositing) at least one 2D material on or over the substrate 102, and subjecting the 2D material to at least one laser treatment process employing one or more selected frequencies of electromagnetic radiation corresponding to (e.g., the same as) one or more resonant frequencies of crystalline defects of the 2D material. Exposing the 2D material to the selected frequencies of electromagnetic radiation at least partially (e.g., substantially) eliminates the crystalline defects from the 2D material. The selected frequencies of radiation selectively energize, dissociate, and mobilize the crystalline defects of the 2D material. The crystalline defects migrate (e.g., diffuse) in-plane toward terminal ends (e.g., peripheral sides, peripheral edges) of the 2D material, where they may be removed from (e.g., eliminated from) the 2D material. In addition, as the crystalline defects move across the 2D material, complementary defects (e.g., oppositely charged defects) coming into geometric proximity to one another may be attracted to each other (e.g., by way of coulombic attraction) and interact to eliminate one another. For example, if the 2D material comprises a TMDC, a mobile X-interstitial defect may be attracted to and interact with a mobile X-vacancy defect in close geometric proximity thereto and eliminate both the X-interstitial defect and the X-vacancy defect, and/or a mobile M-interstitial defect may be attracted to and interact with a mobile M-vacancy defect in close geometric proximity thereto and eliminate both the M-interstitial defect and the M-vacancy defect.

The at least one 2D material may formed on or over the substrate 102 using one or more of a growth process and a deposition process. By way of non-limiting example, the 2D material may be formed on or over the substrate 102 using one or more of an in situ growth process, a physical vapor deposition ("PVD") process, a chemical vapor deposition ("CVD") process, a metallorganic chemical vapor deposition ("MOCVD") process, a plasma-enhanced chemical vapor deposition (PECVD) process, an atomic layer deposition ("ALD") process, a spin-coating process, and a blanket coating process. In situ growth processes include, but are not limited to, epitaxial growth processes, such as atomic layer epitaxy (ALE), pulsed atomic layer epitaxy (PALE), molecular beam epitaxy (MBE), gas source MBE, organometallic MBE, and chemical beam epitaxy (CBE). PVD processes include, but are not limited to, one or more of sputtering, evaporation, and ionized PVD. The process utilized to form the 2D material on or over the substrate 102 may at least partially depend on the material properties of the 2D material and the substrate 102, and may affect the number (e.g., density) of crystalline defects present in the 2D material. In some embodiments, the 2D material is formed on or over the substrate 102 using a CVD process.

The laser treatment process includes selecting at least one frequency of electromagnetic radiation to expose the at least one 2D material to, and exposing the 2D material to the selected frequency of electromagnetic radiation. The frequency of electromagnetic radiation may be selected at least partially based on a comparison of vibrational spectra for a crystalline-defect-free (e.g., perfect, pristine) form of the 2D material and a crystalline-defect-laden (e.g., imperfect, defective) form of the 2D material. Mutual resonant frequencies along the vibrational spectra (e.g., as compared by a vibrational difference spectrum) for the crystalline-defect-free form of the 2D material and the crystalline-defect-laden form of the 2D material that do not exhibit substantial overlap between resonant peak intensities of the crystalline-defect-free form of the 2D material and the crystalline-defect-laden form of the 2D material identify frequencies of electromagnetic radiation that may be used to selectively energize, mobilize, and at least partially (e.g., substantially) eliminate crystalline defects within the 2D material.

Figure 2:
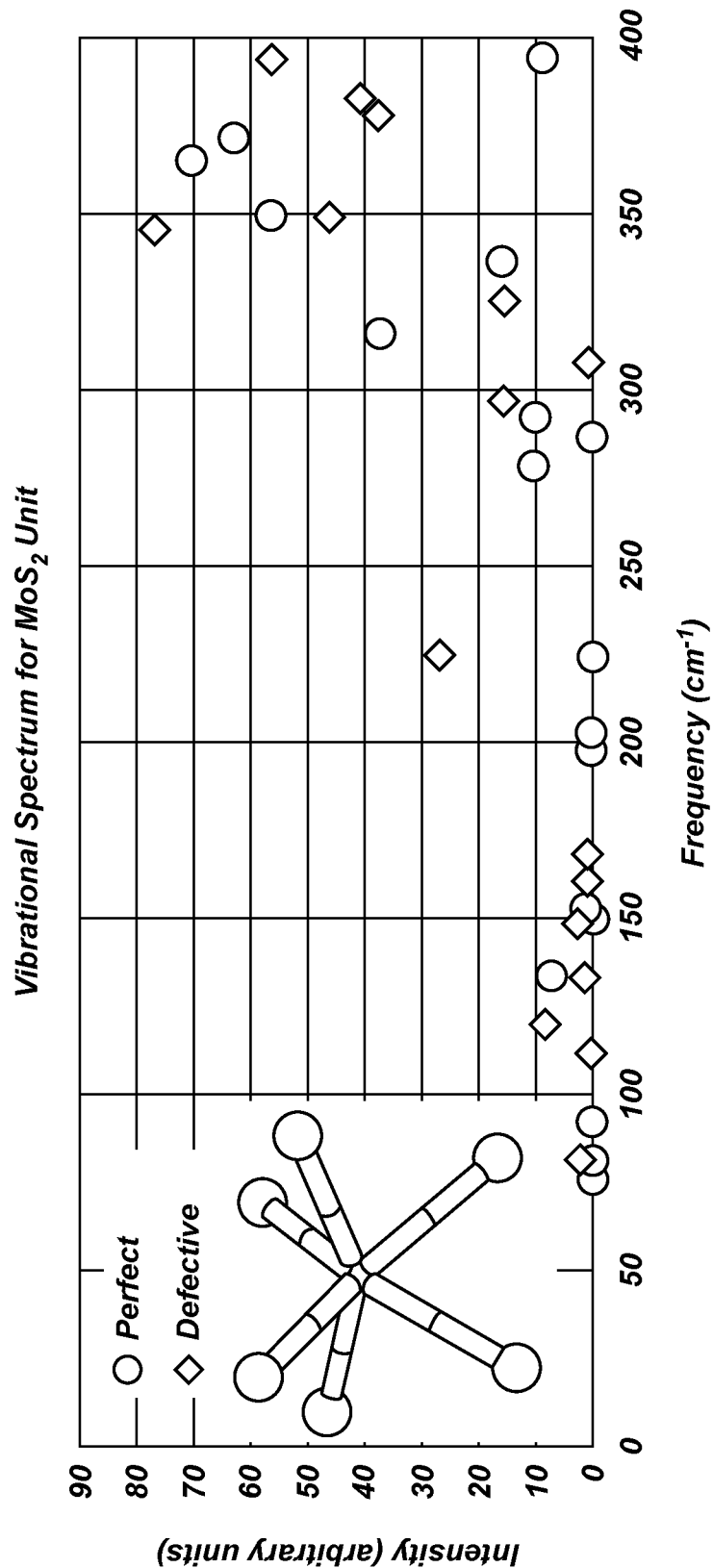
FIG. 2 is a graph illustrating vibrational spectra for a crystalline-defect-free ("perfect") form of molybdenum disulfide ($MoS_2$) and a crystalline-defect-laden ("defective") form of $MoS_2$.

As a non-limiting example, FIG. 2 is a graph plotting vibrational spectra for a crystalline-defect-free ("perfect") form of $MoS_2$ and a crystalline-defect-laden ("defective") form of $MoS_2$. As shown in FIG. 2, the graph identifies different resonant frequencies where the resonant peak intensity of the crystalline-defect-laden form of $MoS_2$ is substantially offset from (e.g., substantially different than) the resonant peak intensity of the crystalline-defect-free form of $MoS_2$. For example, the crystalline-defect-laden form of $MoS_2$ exhibits relatively high resonant peak intensities at least at resonant frequencies of about 224.3 $cm^{-1}$, about 345.1 $cm^{-1}$, and about 382.2 $cm^{-1}$, whereas the crystalline-defect-free form of $MoS_2$ exhibits relatively low resonant peak intensities at those resonant frequencies. Accordingly, based on the vibrational spectra for the crystalline-defect-free form of $MoS_2$ and the crystalline-defect-laden form of $MoS_2$, one or more of an electromagnetic radiation frequency of about 224.3 $cm^{-1}$, an electromagnetic radiation frequency of about 345.1 $cm^{-1}$, and an electromagnetic radiation frequency of about 382.2 $cm^{-1}$ may, for example, be selected to treat $MoS_2$ formed on or over the substrate 102 to reduce a crystalline defect density of the $MoS_2$. Vibrational spectra for crystalline-defect-free and crystalline-defect-laden forms of $MoS_2$ may be different (e.g., resonant peaks may shift to different vibrational frequencies) than those depicted in FIG. 2 depending, for example, on the properties (e.g., material composition) of a substrate (e.g., the substrate 102) upon which the $MoS_2$ is formed. Nonetheless, even if, for a given underlying substrate, vibrational spectra for crystalline-defect-free and crystalline-defect-laden forms of $MoS_2$ are different than shown in FIG. 2, mutual resonant frequencies where the resonant peak intensity of a crystalline-defect-laden form of $MoS_2$ is substantially different than the resonant peak intensity of a crystalline-defect-free form of $MoS_2$ identify frequencies of electromagnetic radiation that may be selected and used to treat $MoS_2$ formed over the given substrate to reduce the number of crystalline defects within the $MoS_2$.

A vibrational spectrum for the crystalline-defect-free form of the 2D material may be generated (e.g., calculated) using one or more conventional modeling processes, such as one or more conventional computational quantum mechanical modeling processes, which are not described in detail herein. The modeling process may include geometry optimization followed by vibrational analysis. By way of non-limiting example, the vibrational spectrum for the crystalline-defect-free form of the 2D material may be calculated using a conventional density functional theory (DFT) analysis process. The unit structure of the 2D material may be defined and analyzed to determine how the crystalline-defect-free form of the 2D material would theoretically be formed on a given substrate. Computational analysis of the crystalline-defect-free form of the 2D material may then be performed to evaluate resonance thereof at different vibrational frequencies and develop the vibrational spectrum thereof.

A vibrational spectrum for the crystalline-defect-laden form of the 2D material may be generated using one or more conventional vibrational spectroscopy processes, such as one or more of a conventional infrared spectroscopy process and a conventional Raman spectroscopy process, which are not described in detail herein. An actual (e.g., non-modeled, non-theoretical) crystalline-defect-laden form of the 2D material may be subjected to a conventional vibrational spectroscopy process (e.g., a conventional 2D infrared spectroscopy process) to generate a vibrational spectrum for the crystalline-defect-laden form of the 2D material that may be compared against a vibrational spectrum generated for the crystalline-defect-free form of the 2D material through the conventional computational quantum mechanical modeling process. Non-limiting examples, of suitable vibrational spectroscopy processes for generating a vibrational spectrum for the crystalline-defect-laden form of the 2D material include four-wave mixing processes and pump-probe processes (e.g., two-pulse photon echo processes, three-pulse photon echo processes, heterodyned four-wave mixing processes, homodyne four-wave mixing processes, dual-frequency heterodyned transient grating processes, frequency resolved four-wave mixing processes, spectrally resolved four-wave mixing processes, pulse shaping four-wave mixing processes, narrow band four-wave mixing processes, broad band four-wave mixing processes, time-gated four-wave mixing processes), six-wave mixing process, and eight-wave mixing processes. In additional embodiments, a vibrational spectrum for the crystalline-defect-laden form of the 2D material may be generated using one or more conventional modeling processes, such as one or more conventional computational quantum mechanical modeling processes.

After selecting at least one frequency of electromagnetic radiation with which to expose the at least one 2D material, the 2D material may be treated with (e.g., exposed to, subjected to) the selected frequency of electromagnetic radiation using at least one laser source configured and operated to generate one or more laser beams having the selected frequency of electromagnetic radiation. Any laser source capable of generating and directing at least one laser beam having the selected frequency of electromagnetic radiation toward the 2D material may be employed. By way of non-limiting example, the laser source may comprise one or more of a gas laser (e.g., a carbon monoxide (CO) laser; a carbon dioxide ($CO_2$) laser), a semiconductor laser (e.g., a lead (Pb) salt semiconductor laser; a quantum cascade laser (QCL)), and a solid-state laser.

The selected frequency of electromagnetic radiation may be produced by a single (e.g., only one) laser source, or may be produced by multiple (e.g., more than one) laser sources. If multiple laser sources are utilized, each of the multiple laser sources may be substantially the same as one another and may produce substantially the same selected frequency of electromagnetic radiation, or at least one of the multiple laser sources may be different than and/or produce a different selected frequency of electromagnetic radiation than at least one other of the multiple laser sources. In some embodiments, a single selected frequency of electromagnetic radiation is produced by a single laser source. In additional embodiments, a single selected frequency of electromagnetic radiation is produced by multiple laser sources. In further embodiments, multiple selected frequencies of radiation are produced by multiple laser sources. If multiple laser sources are utilized, the multiple laser sources may be used simultaneously, sequentially, or combinations thereof. For example, one or more of the multiple laser sources may be used to treat the 2D material(s) with a first selected frequency of electromagnetic radiation corresponding to a first resonant frequency where resonant peak intensities of crystalline-defect-free and crystalline-defect-laden forms of the 2D material(s) are different than (e.g., offset from) one another, and then one or more other of the multiple laser sources may subsequently be used to treat the 2D material(s) with a second selected frequency of electromagnetic radiation corresponding to a second resonant frequency where resonant peak intensities of the crystalline-defect-free and the crystalline-defect-laden forms of the 2D material(s) are different than one another. As another example, one or more of the multiple laser sources may be used to treat the 2D material(s) with a first selected frequency of electromagnetic radiation corresponding to a first resonant frequency where resonant peak intensities of crystalline-defect-free and crystalline-defect-laden forms of the 2D material(s) are different than one another, and one or more other of the multiple laser sources may be used simultaneously with the one or more of the multiple laser sources to treat the 2D material(s) with a second selected frequency of electromagnetic radiation corresponding to a second resonant frequency where resonant peak intensities of the crystalline-defect-free and the crystalline-defect-laden forms of the 2D material(s) are different than one another.

The laser treatment process may employ any laser beam power(s) and duration(s) of exposure sufficient to reduce or even eliminate a crystalline defect density of the 2D material(s). The laser beam power(s) and duration(s) for a given application may at least partially depend on the electromagnetic radiation frequency (or frequencies) utilized, and the properties (e.g., material composition, dimensions) of the 2D material(s). An attenuator device may be used to control a laser beam power level (e.g., intensity) at a surface of the 2D material(s) to a level facilitating selective energization, mobilization, and at least partial (e.g., substantial) elimination of crystalline defects within the 2D material(s). A laser beam power level at a surface of the 2D material(s) may, for example, be within a range of from about 1 Watt (W) to about 1000 W. In addition, a modulator device (e.g., an acousto-optical modulator device) may be used to control a duration of laser beam exposure. A duration of laser beam exposure may, for example, be within a range of from about 1 millisecond (ms) to about 30 seconds (s).

The laser treatment process may expose the 2D material(s) to a single (e.g., only one) dose of one or more selected frequencies of electromagnetic radiation to form the 2D material structure 104 (FIG. 1), or may expose the 2D material(s) to multiple doses of one or more selected frequencies of radiation to form the 2D material structure 104. If multiple doses are utilized, an initial dose may partially reduce a crystalline defect density of the 2D material(s), and at least one other dose may further reduce the crystalline defect density of the 2D material(s) to form the 2D material structure 104. Each of the multiple doses may be substantially the same (e.g., employ substantially the same selected radiation frequency, power, and duration), or at least one of the multiple doses may be different than at least one other of the multiple doses (e.g., employ a different selected radiation frequency, a different power, and/or a different duration).

Exposing a 2D material to a selected frequency (or frequencies) of electromagnetic radiation corresponding to a specific resonant frequency (or frequencies) along the multidirectional vibrational spectra of crystalline-defect-free and crystalline-defect-laden forms of the 2D material exhibiting differences between respective resonant peak intensities facilitates a high degree of selectivity as to what types of chemical bonds within the 2D material are modified using the radiation. When the 2D material is exposed to the selected frequency of electromagnetic radiation only chemical bonds that resonate at or near the selected frequency will be given the most energy by the radiation. The selected frequency of electromagnetic radiation may be absorbed by chemical bonds forming defective regions of (e.g., crystalline defects within) a 2D material, without being substantially absorbed by chemical bonds forming non-defective regions of the 2D material, chemical bonds of the substrate 102 (FIG. 1), chemical bonds between the 2D material and the substrate 102, and chemical bonds between the 2D material and another 2D material (if any). Accordingly, the selected frequencies of electromagnetic radiation may selectively modify only the chemical bonds forming crystalline defects of the 2D material. Electromagnetic radiation that is not absorbed by chemical bonds forming defective regions of the 2D material may be reflected or may be transmitted through the 2D material and the substrate 102. Consequently, using the selected frequencies of electromagnetic radiation to reduce the crystalline defect density of the 2D material may generate little to no heat in areas of the 2D material (and the substrate 102) not proximate the chemical bonds that the electromagnetic radiation has been selected to resonate with. By controlling the generation and use of heat in semiconductor device manufacturing, introduction of thermal defects can be avoided, and low-temperature manufacturing techniques can be more easily achieved.

Thus, in accordance with embodiments of the disclosure, a method of forming a semiconductor device structure comprises forming at least one 2D material over a substrate. The at least one 2D material is treated with at least one laser beam having a frequency of electromagnetic radiation corresponding to a resonant frequency of crystalline defects within the at least one 2D material to selectively energize and remove the crystalline defects from the at least one 2D material.

In addition, in accordance with additional embodiments of the disclosure, another method of forming a semiconductor device structure comprises subjecting a 2D material on a substrate to a laser treatment process to reduce a crystalline defect density of the 2D material. The laser treatment process comprises exposing the 2D material to at least one frequency of electromagnetic radiation substantially the same as at least one resonant frequency of crystalline-defect-free and crystalline-defect-laden forms of the 2D material where resonant peak intensities of the crystalline-defect-free and crystalline-defect-laden forms of the 2D material are different than one another.

In some embodiments, a thermal annealing process may be used in conjunction with the laser treatment process to facilitate or enhance a reduction in the crystalline defect density of the 2D material(s) and form the 2D material structure 104 (FIG. 1). If employed, the thermal annealing process may heat the 2D material(s) to a temperature greater than a formation (e.g., growth, deposition) temperature of the 2D material(s) to raise a ground state of all atoms and crystalline defects and increase a rate of diffusion of the crystalline defects out of the 2D material(s). By way of non-limiting example, if the 2D material (e.g., $MoS_2$) is formed at a temperature less than or equal to about 225° C., the thermal annealing process may subject the 2D material to a temperature greater than about 225° C. (e.g., greater than or equal to about 250° C., greater than or equal to about 300° C., or greater than or equal to about 400° C.) to raise a ground state of all atoms (e.g., Mo atoms, S atoms) and crystalline defects (e.g., S-interstitial defects, S-vacancy defects, Mo-interstitial defects, Mo-vacancy defects, MoS-vacancy defects, and SS-vacancy defects) and increase a rate of diffusion of the crystalline defects out of the 2D material(s) during the laser treatment process. Suitable thermal annealing processes include, but are not limited to, furnace annealing processes, chamber annealing processes, and laser annealing processes. In additional embodiments, the laser treatment process may be performed without performing a thermal annealing process in conjunction therewith. In further embodiments, one or more of a magnetic field, an electrical field, a bias, or a combination thereof, may be employed to increase the rate of diffusion of the crystalline defects out of the 2D material(s).

The 2D material(s) may be subjected to the laser treatment process and the thermal annealing process (if any) during the formation (e.g., deposition, growth) of the 2D material(s) on or over the substrate 102, after the formation of the 2D material(s) on or over the substrate 102, or a combination thereof. If a thermal annealing process is employed in conjunction with the laser treatment process, the laser treatment process and the thermal annealing process may be performed in any order, and with any amount of temporal overlap therebetween. The laser treatment process and the thermal annealing process (if any) may be performed simultaneously, sequentially, or a combination thereof. In addition, there is no limit to the number of times a laser treatment process and/or a thermal annealing process can be performed. Accordingly, one or more of the laser treatment process and the thermal annealing process (if any) may be performed multiple times, and not necessarily in the same order nor with the same temporal overlap for each repetition of the laser treatment process and the thermal annealing process (if any).

In some embodiments, at least one 2D material is subjected to the laser treatment process during the formation of the 2D material on or over the substrate 102 to selectively energize, mobilize, and at least partially (e.g., substantially) eliminate crystalline defects within the 2D material. In addition, the laser treatment process is performed without performing the thermal annealing process concurrent therewith. Put another way, the 2D material is subjected to the laser treatment process without using a separate thermal annealing process (e.g., a furnace annealing process, a chamber annealing process, a laser annealing process) to heat the 2D material to a temperature greater than a formation temperature thereof. In such embodiments, heat supplied by the process (e.g., deposition process, growth process) used to form the 2D material may, by itself, be sufficient to raise a ground state of all atoms and crystalline defects of the 2D material and facilitate a desirable rate of diffusion of the crystalline defects out of the 2D material.

In additional embodiments, at least one 2D material is subjected to the laser treatment process and the thermal annealing process during the formation of the 2D material on or over the substrate 102 to selectively energize, mobilize, and at least partially (e.g., substantially) eliminate crystalline defects within the 2D material. The thermal annealing process (e.g., furnace annealing process, chamber annealing process, laser annealing process) is performed concurrent with the laser treatment process. The thermal annealing process is employed to heat the 2D material to a temperature greater than that which would otherwise be achieved by the heat supplied by the process (e.g., deposition process, growth process) used to form the 2D material alone. The separate thermal annealing process raises a ground state of all atoms and crystalline defects of the 2D material to increase the rate of diffusion of the crystalline defects out of the 2D material during the formation thereof.

In yet additional embodiments, at least one 2D material is formed on or over the substrate 102, and is then subjected to the laser treatment process and the thermal annealing process to selectively energize, mobilize, and at least partially (e.g., substantially) eliminate crystalline defects within the 2D material. Put another way, the laser treatment process and the thermal annealing process are each performed only after the 2D material has already been formed (e.g., deposited, grown) on or over the substrate 102. The laser treatment process and the thermal annealing process may, for example, be used to repair the 2D material after an intervening period of time has passed subsequent to the formation of the 2D material. The 2D material may have cooled from a formation temperature thereof during the intervening period of time. The thermal annealing process (e.g., furnace annealing process, chamber annealing process, laser annealing process) is performed concurrent with the laser treatment process. The thermal annealing process raises a ground state of all atoms and crystalline defects of the 2D material to increase the rate of diffusion of the crystalline defects out of the 2D material during the concurrent laser treatment process.

In further embodiments, at least one 2D material is formed on or over the substrate 102, the formed 2D material is then subjected to thermal annealing process, and then the thermally treated 2D material is subjected to the laser treatment process to selectively energize, mobilize, and at least partially (e.g., substantially) eliminate crystalline defects within the thermally treated 2D material. Put another way, the thermal annealing process is performed only after the 2D material has already been formed (e.g., deposited, grown) on or over the substrate 102, and the laser treatment process is performed after the thermal annealing process. The sequence of the thermal annealing process and the laser treatment process may, for example, be used to repair the 2D material after an intervening period of time has passed subsequent to the formation of the 2D material. The 2D material may have cooled from a formation temperature thereof during the intervening period of time. The thermal annealing process raises a ground state of all atoms and crystalline defects of the 2D material to increase the rate of diffusion of the crystalline defects out of the 2D material during the subsequent laser treatment process.

In yet further embodiments, at least one 2D material is formed on or over the substrate 102, the formed 2D material is then subjected to the laser treatment process, and then the laser treated 2D material is subjected to the thermal annealing process. Put another way, the laser treatment process is performed only after the 2D material has already been formed (e.g., deposited, grown) on or over the substrate 102, and the thermal annealing process is performed after the laser treatment process. The sequence of the laser treatment process and the thermal annealing process may, for example, be used to repair the 2D material after an intervening period of time has passed subsequent to the formation of the 2D material. The 2D material may have cooled from a formation temperature thereof during the intervening period of time. In some embodiments, the thermal annealing process is effectuated after the start of but prior to the completion of the laser treatment process, and raises a ground state of all atoms and crystalline defects of the 2D material to increase the rate of diffusion of the crystalline defects out of the 2D material during the remainder of the laser treatment process. In additional embodiments, the thermal annealing process is effectuated after the completion of the laser treatment process.

In addition, a remote plasma treatment process may be used in conjunction with at least the laser treatment process (and the thermal treatment process, if any) to promote the formation of the 2D material structure 104 (FIG. 1). The remote plasma treatment process may, for example, be used to treat a surface of one or more 2D material(s) to promote the formation of one or more additional 2D material(s) thereon or thereover. The remote plasma treatment process may promote nucleation of the additional 2D material(s) on or over the surface(s) of the 2D material(s). If employed, the remote plasma treatment process may be performed after the formation of a 2D material on or over the substrate 102. The remote plasma treatment process may, for example, be performed after at least the laser treatment process (and the thermal treatment process, if any) of the 2D material on or over the substrate 102.

With continued reference to FIG. 1, following the formation of the 2D material structure 104, the semiconductor device structure 100 including the 2D material structure 104 may be subjected to additional processing (e.g., material removal processes, additional deposition processes), as desired. The additional processing may be conducted using conventional processes and conventional processing equipment, and is not illustrated or described in detail herein.

Semiconductor device structures (e.g., the semiconductor device structure 100) formed in accordance with embodiments of the disclosure may be used in various semiconductor devices including, but not limited to, memory (e.g., random access memory (ROM), read only memory (ROM)), transistors (e.g., field-effect transistors (FETs), thin film transistors (TFTs), bipolar transistors), diodes, inverters, logic gates, junctions, photodetectors, photovoltaic cells, light-emitting diodes (LEDs), electronic sensors, integrated circuits, and microprocessors. By way of non-limiting example, semiconductor device structures formed in accordance with embodiments of the disclosure may be used in various FETs including, but not limited to, tunnel field-effect transistors (TFETs) (e.g., single gate TFETs, double gate TFETs, lateral TFETs, vertical TFETs, synthetic electric field TFETs (SE-TFETs)), and vertical FETs (VFETs). The 2D material structures (e.g., 2D material structure 104) of the semiconductor device structures (e.g., the semiconductor device structure 100) formed in accordance with embodiments of the disclosure may, for example, be employed as channels of the FETs.

Figure 3:
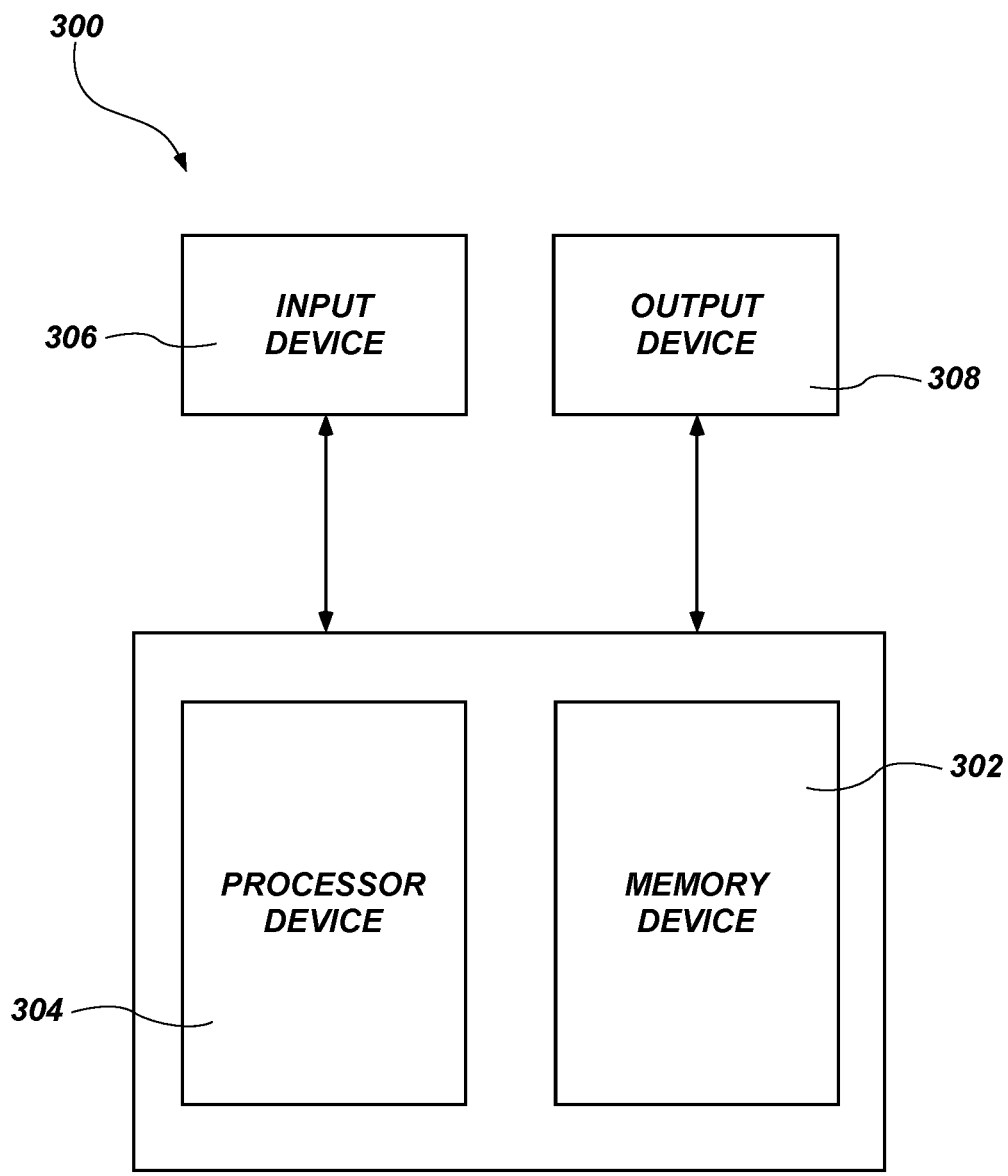
FIG. 3 is a schematic block diagram of an electronic system, in accordance with embodiments of the disclosure.

In addition, semiconductor devices (e.g., memory, transistors, diodes, inverters, logic gates, junctions, photodetectors, photovoltaic cells, LEDs, electronic sensors, integrated circuits, microprocessors) formed in accordance with embodiments of the disclosure may be included in various electronic systems. By way of non-limiting example, FIG. 3 is a block diagram of an electronic system 300 according to embodiments of disclosure. The electronic system 300 may comprise, for example, a computer or computer hardware component, a server or other networking hardware component, a cellular telephone, a digital camera, a personal digital assistant (PDA), a portable media (e.g., music) player, a WiFi or cellular-enabled tablet such as, for example, an iPad® or SURFACE® tablet, an electronic book, a navigation device, etc. The electronic system 300 includes at least one memory device 302. The at least one memory device 302 may include, for example, an embodiment of the semiconductor device structure 100 shown in FIG. 1. The electronic system 300 may further include at least one electronic signal processor device 304 (e.g., microprocessor). The electronic signal processor device 304 may, optionally, include a semiconductor device structure similar to an embodiment of the semiconductor device structure 100 shown in FIG. 1. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The one or more input devices 306 and output devices 308 may communicate electrically with at least one of the memory device 302 and the electronic signal processor device 304.

Thus, a semiconductor device according to embodiments of the disclosure comprises at least one semiconductor device structure comprising a 2D material structure overlying a substrate and comprising a 2D material substantially free of interstitial defects and vacancy defects.

Furthermore, an electronic system according to embodiments of the disclosure comprises at least one semiconductor device and peripheral circuitry electrically connected to the at least one semiconductor device. The at least one semiconductor device includes at least one semiconductor device structure comprising a substrate, and a 2D material structure over the substrate and comprising one or more 2D materials substantially free of crystalline defects.

The methods of the disclosure may effectively reduce crystalline defects (e.g., interstitial defects, vacancy defects) in one or more 2D material(s) to facilitate the formation of semiconductor device structures (e.g., the semiconductor device structure 100) having improved electrical properties as compared to conventional semiconductor device structures not formed in accordance with embodiments of the disclosure. The laser treatment processes of the disclosure may reduce crystalline defect densities of the 2D material(s) while avoiding undesirable changes (e.g., undesirable structural deformations, undesirable material diffusion) to the 2D material(s) and/or other structures (e.g., the substrate 102) operatively associated therewith (e.g., bound thereto). Semiconductor device structures (e.g., the semiconductor device structure 100) according to embodiments of disclosure may, in turn, improve one or more properties of devices into which they are at least partially incorporated. Semiconductor devices and electronic systems including semiconductor device structures formed using the methods of the disclosure may have enhanced performance, reliability, and durability as compared to many conventional semiconductor devices and electronic systems.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A semiconductor device, comprising at least one semiconductor device structure comprising:
   a base material; and
   a 2D material structure on the base material and comprising a stack including substantially crystalline-defect-free forms of two or more of at least one carbide and at least one carbonitride having the general chemical formula $M_{n+1}X_n$, where:
   M is a transition metal from Groups IV or V of the Periodic Table of Elements; and
   X is one or more of C and N.

2. The semiconductor device structure of claim 1, wherein the 2D material structure further comprises one or more of graphene, graphene-oxide, stanene, phosphorene, hexagonal boron nitride, borophene, silicene, graphyne, germanene, germanane, and a 2D supracrystal.

3. The semiconductor device structure of claim 1, wherein the 2D material structure further comprises one or more monolayers of one or more of $MoS_2$, $MoSe_2$, $MoTe_2$, $WS_2$, $WSe_2$, $WTe_2$, $NbSe_2$, $ZrS_2$, $ZrSe_2$, $HfS_2$, $HfSe_2$, and $ReSe_2$.

4. The semiconductor device structure of claim 1, wherein the 2D material structure further comprises a monolayer of a metal material, a semi-metal material, or a semiconductive material.

5. The semiconductor device of claim 1, wherein the stack of the 2D material structure further comprises another 2D material coupled to at least one of the two or more of the at least one carbide and the at least one carbonitride through intermolecular forces, the another 2D material substantially free of interstitial defects and vacancy defects.

6. The semiconductor device of claim 5, wherein the another 2D material comprises a transition metal dichalcogenide monolayer.

7. The semiconductor device of claim 1, wherein the 2D material structure comprises a channel of a transistor.

\* \* \* \* \*

UNITED STATES PATENT AND TRADEMARK OFFICE
CERTIFICATE OF CORRECTION

PATENT NO. : 11,393,687 B2
APPLICATION NO. : 15/986129
DATED : July 19, 2022
INVENTOR(S) : Roy E. Meade and Sumeet C. Pandey It is certified that error appears in the above-identified patent and that said Letters Patent is hereby corrected as shown below:

In the Specification

| | | |
|---|---|---|
| Column 1, | Line 10, | change "2018 the" to --2018, the-- |
| Column 1, | Line 59, | change "W; X==S," to --W; X=S,-- |

Signed and Sealed this
Sixth Day of December, 2022

Katherine Kelly Vidal
*Director of the United States Patent and Trademark Office*